(12) United States Patent
Chen et al.

(10) Patent No.: US 10,388,788 B2
(45) Date of Patent: Aug. 20, 2019

(54) SEMICONDUCTOR DEVICE AND METHOD OF FORMING THE SAME

(71) Applicant: UNITED MICROELECTRONICS CORP., Hsin-Chu (TW)

(72) Inventors: Shao-Ping Chen, Kaohsiung (TW); Huan-Chi Ma, Tainan (TW); Chien-Wen Yu, Kaohsiung (TW); Kuo-Chin Hung, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 40 days.

(21) Appl. No.: 15/636,632

(22) Filed: Jun. 28, 2017

(65) Prior Publication Data
US 2018/0342618 A1 Nov. 29, 2018

(30) Foreign Application Priority Data

May 25, 2017 (TW) .............................. 106117321 A

(51) Int. Cl.
*H01L 29/78* (2006.01)
*H01L 21/768* (2006.01)
*H01L 23/522* (2006.01)
*H01L 29/45* (2006.01)

(52) U.S. Cl.
CPC .... *H01L 29/7845* (2013.01); *H01L 21/76802* (2013.01); *H01L 21/76843* (2013.01); *H01L 21/76864* (2013.01); *H01L 23/5226* (2013.01); *H01L 29/456* (2013.01)

(58) Field of Classification Search
CPC ............... H01L 29/7845; H01L 29/456; H01L 21/76802; H01L 21/76843; H01L 21/76864; H01L 23/5226
USPC ........................................................ 257/409
See application file for complete search history.

(56) References Cited

U.S. PATENT DOCUMENTS

| 8,187,969 | B2 | 5/2012 | Kim | |
|---|---|---|---|---|
| 9,029,920 | B2 | 5/2015 | Xie | |
| 2004/0058548 | A1* | 3/2004 | Sohn | H01L 21/26513 438/694 |
| 2008/0157208 | A1* | 7/2008 | Fischer | H01L 21/76843 257/368 |
| 2011/0084320 | A1* | 4/2011 | Jung | H01L 21/28512 257/288 |
| 2013/0001555 | A1* | 1/2013 | Yin | H01L 21/28518 257/52 |
| 2014/0273386 | A1* | 9/2014 | Tsao | H01L 29/665 438/301 |
| 2016/0071800 | A1* | 3/2016 | Hung | H01L 21/76879 257/288 |
| 2017/0103948 | A1* | 4/2017 | Lee | H01L 21/28518 |

* cited by examiner

*Primary Examiner* — Tong-Ho Kim
(74) *Attorney, Agent, or Firm* — Winston Hsu

(57) ABSTRACT

A method for forming a semiconductor device is disclosed. A p-type field-effect transistor (p-FET) is formed on a semiconductor substrate. A dielectric layer is formed on the semiconductor substrate and completely covers the p-FET. At least an opening is formed in the dielectric layer and exposes a source/drain region of the p-FET. A conductive material is then formed filling the opening, wherein the conductive material comprises a first stress; specifically, a tensile stress between 400 and 800 MPa.

14 Claims, 6 Drawing Sheets

SEMICONDUCTOR DEVICE AND METHOD OF FORMING THE SAME

BACKGROUND OF THE INVENTION

1. Field of the Invention

The invention generally relates to a semiconductor device and method of forming the same. More particularly, the invention relates to a p-type field-effect transistor (p-FET) having contact plugs comprising tensile stress.

2. Description of the Prior Art

In the field of semiconductor technology, shrinking the dimensions of semiconductor devices results in better performance and higher degree of integration. Scaling down the thickness of the gate dielectric layer of a field-effect transistor (FET) can eliminate the short channel effect, thereby obtaining better current driving capability. The integrity of a gate oxide becomes critical as its thickness is reduced. The predicted lifetime of a semiconductor device determined in a reliability test strongly depends upon the negative bias temperature instability (NBTI) performance of p-type transistors. Therefore, improving the NBTI performance is an issue which has drawn a lot of attention in the field.

SUMMARY OF THE INVENTION

One objective of the present invention is to provide a semiconductor device having improved p-FET NBTI performance.

In one aspect of the present invention, a method for forming a semiconductor device is disclosed. First, a p-type field-effect transistor (p-FET) is formed on a semiconductor substrate. Subsequently, a dielectric layer is formed on the semiconductor substrate, covering the p-FET. An opening is then formed in the dielectric layer to expose a source/drain region of the p-FET. After that, a conductive material having a stress is formed to fill the opening. In a preferred embodiment, the stress of the conductive material is a tensile stress for the semiconductor substrate, wherein the magnitude of the tensile stress is between 400 and 800 MPa.

In another aspect of the present invention, a semiconductor device is disclosed. The semiconductor device includes a semiconductor substrate and a p-type field-effect transistor (p-FET) formed thereon. A dielectric layer is formed on the semiconductor substrate and covers the p-FET. A contact plug is formed in the dielectric layer and contacts a source/drain region of the p-FET, wherein the contact plug is filled with a conductive material providing a stress. In a preferred embodiment, the stress of the conductive material is a tensile stress for the semiconductor substrate, wherein the magnitude of the tensile stress is between 400 and 800 MPa.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

DETAILED DESCRIPTION

Figure 1:
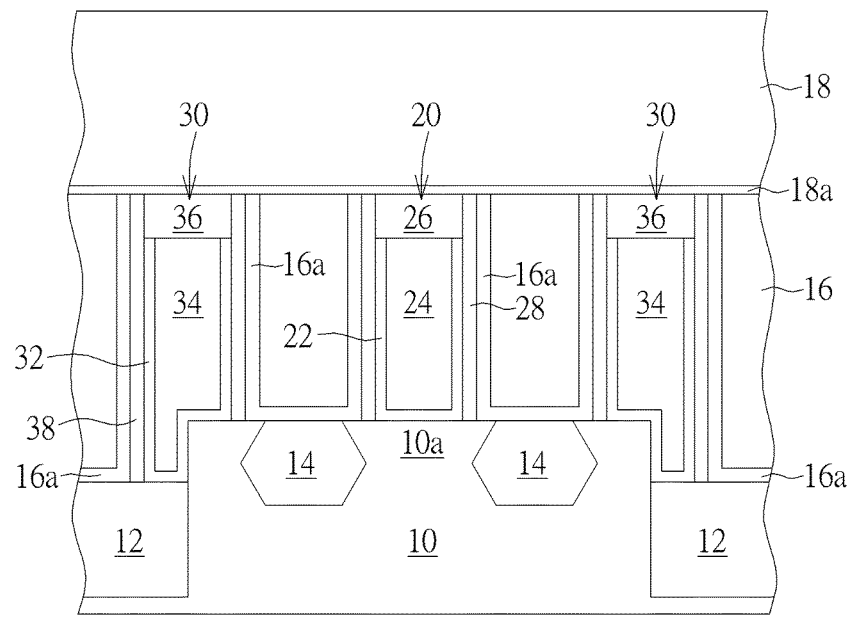
FIG. 1 to FIG. 4 are cross-sectional diagrams illustrating the steps for forming a semiconductor device according to a preferred embodiment of the present invention.

In the following description, numerous specific details are given to provide a thorough understanding of the invention. It will, however, be apparent to one skilled in the art that the invention may be practiced without these specific details. Furthermore, some system configurations and process steps are not disclosed in detail, as these should be well-known to those skilled in the art. Other embodiments may be utilized, and structural, logical, and electrical changes may be made without departing from the scope of the present invention.

The drawings showing embodiments of the apparatus are semi-diagrammatic and not to scale, and some dimensions are exaggerated in the figures for clarity of presentation. Where multiple embodiments are disclosed and described as having some features in common, like or similar features will usually be described with like reference numerals for ease of illustration and description thereof.

FIG. 1 to FIG. 4 are cross-sectional diagrams illustrating the steps for forming a semiconductor device according to a preferred embodiment of the present invention. As shown in FIG. 1, a substrate 10 is provided. The substrate 10 is a semiconductor substrate, such as a silicon substrate, an epitaxial silicon substrate, a silicon-germanium substrate, a silicon carbide substrate or a silicon-on-insulator (SOI) substrate, but is not limited hereto. An isolation structure 12 is formed in the substrate 10 and defines at least an active area 10a in the substrate 10. At least agate structure 20 is formed on the active area 10a and traverses across the active area 10a along a depth direction of FIG. 1. A source/drain region 14 is formed in the substrate 10 and is adjacent to each side of the gate structure 20. The substrate 10, the gate structure 20 and the source/drain regions 14 adjacent to the two opposite sides of the gate structure 20 collectively comprises a transistor; for example, a planar field effect transistor or a fin field effect transistor (finFET). According to the preferred embodiment, the transistor shown in FIG. 1 is a p-type finFET, wherein the isolation structure 12 is recessed to be lower than the upper surface of the active area 10a and exposes a sidewall portion (not shown in FIG. 1) of the active area 10a before the gate structure 20 is formed. The gate structure 20 of the p-type finFET traverses across the active area 10a and covers the upper surface and the exposed sidewall portions of the active area 10a.

As shown in FIG. 1, the gate structure 20 includes: a gate electrode 24 disposed on the substrate 10, spacers 28 disposed on the two opposite sides of the gate electrode 24, and a gate dielectric layer 22 formed at least between the gate electrode 24 and the substrate 10. The gate electrode 24 may be made of poly-silicon or work-function metal. The method for forming the gate electrode 24 made of work-function metal may comprise performing a replacement metal gate process after a first interlayer dielectric layer 16 is deposited on the substrate 10. The first interlayer dielectric layer 16 is, for example, a silicon oxide layer formed by a high density plasma (HDP) deposition process for better gap filling. Preferably, the replacement metal gate process is a high-k last replacement metal gate process to form a U-shaped gate dielectric layer 22 between the gate electrode 24, the spacers 28 and the substrate 10. The material of the gate dielectric layer 22 may be silicon oxide, silicon nitride or other high-k dielectric materials, but is not limited hereto. The spacers 28 may be a single-layered or a multi-layered structure, comprising silicon oxide, silicon nitride, or other dielectric materials. According to the preferred embodiment, the gate electrode 24 of the p-type finFET comprises at least a p-type work-function metal layer, such as TiN, TaN or TaC, but is not limited hereto. The work-function metal is formed on the gate dielectric layer 22 and also has a U-shaped cross-sectional profile. The gate electrode 24 may further comprise a filling metal, such as tungsten (W), filling a central portion of the gate electrode 24 defined by the U-shaped work-function metal layer. The gate structure 20 may have a cap layer 26, such as a silicon nitride layer, which is directly atop the gate electrode 24. The source/drain region 14 may be a doped region comprising p-type dopants, such as boron which is formed by an ion implanting process, or an epitaxial layer such as a SiGe layer which is formed by an epitaxial growing process. Preferably, the source/drain region 14 is formed by a self-aligned epitaxial growth process, wherein dummy gate structures 30 disposed on the two terminals of the active region 10a are formed at the same time when forming the gate structure. The source/drain region 14 is formed to be self-aligned with the region between the dummy gate structure 30 and the gate structure 20. Therefore, defects formed in the source/drain region 14 during the epitaxial growing process may be avoided.

Continue to refer to FIG. 1. After the above process is completed, a second interlayer dielectric layer 18 is formed on the first interlayer dielectric layer 16, and covers the entire surface of the first interlayer dielectric layer 16 and the gate structure 20. The second interlayer dielectric layer 18 may be a TEOS oxide layer formed by a chemical vapor deposition (CVD) process. A buffer layer 18a or an additional dielectric layer comprising oxide or nitride may be formed between the first interlayer dielectric layer 16 and the second interlayer dielectric layer 18 according to design needs. In other embodiments, the buffer layer 18a may be omitted. As shown in FIG. 1, a contact etching stop layer (CESL) 16a is preferably formed between the first interlayer dielectric layer 16 and the substrate 10. This CESL can act as an etching stop layer when forming the openings of the source/drain contact plugs (openings 42) in the following process, as illustrated below.

Figure 2:
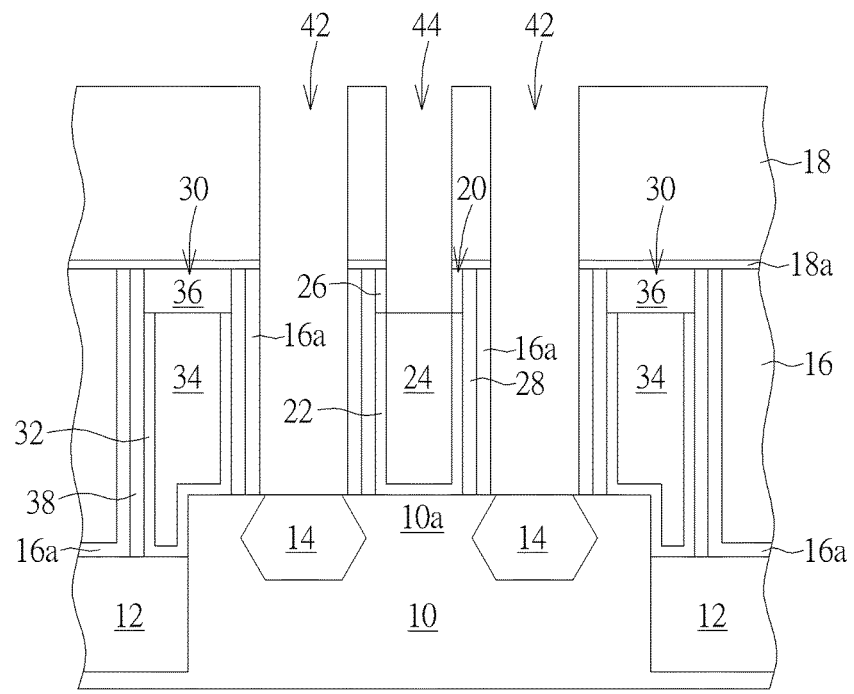

Please refer to FIG. 2. Subsequently, at least a patterning process is performed to form the opening 42. The opening 42 penetrates through the second interlayer dielectric layer 18, the buffer layer 18a, the first interlayer dielectric layer 16 and the contact etching stop layer 16a to exposes the source/drain region 14 of the transistor. The opening 42 is formed between the gate structure 20 and the dummy gate structure 30, and may be in such close proximity to the sidewalls of the gate structure 20 and the dummy gate structure 30 that a portion of the contact etching stop layer 16a on the spacer 28 or the spacer 38 may be exposed in the opening 42. In some embodiments when the space between the gate structure 20 and the dummy gate structure 20 is relatively small, the portion of the contact etching stop layer 16a on the spacer 28 or the spacer 38 may also be removed during the etching step of forming the opening 42. Consequently, the spacer 28 and/or the spacer 38 may be exposed in the opening 42. The opening 42 for forming the source/drain contact plug does not expose any portion of the gate electrode 24 of the gate structure 20. The opening 44 for forming the gate contact plug is formed exposes the gate electrode 24. The opening 44 is formed directly above the gate electrode 24, and penetrates through the second interlayer dielectric layer 18, the buffer layer 18a and the cap layer 26. In the preferred embodiment, the openings 42 and 44 will be filled with the same conductive material in the same process step, forming the source/drain contact plugs and the gate contact plugs at the same time. In other embodiments where the source/drain contact plugs and the gate contact plugs are formed successively in different process steps, the opening 44 in FIG. 2 may be formed and filled in a later step after the opening 42 is filled with the conductive material 52. In such cases, the material filling the opening 44 may be the same or different from the conductive material 52 filling the opening 42.

Figure 3:
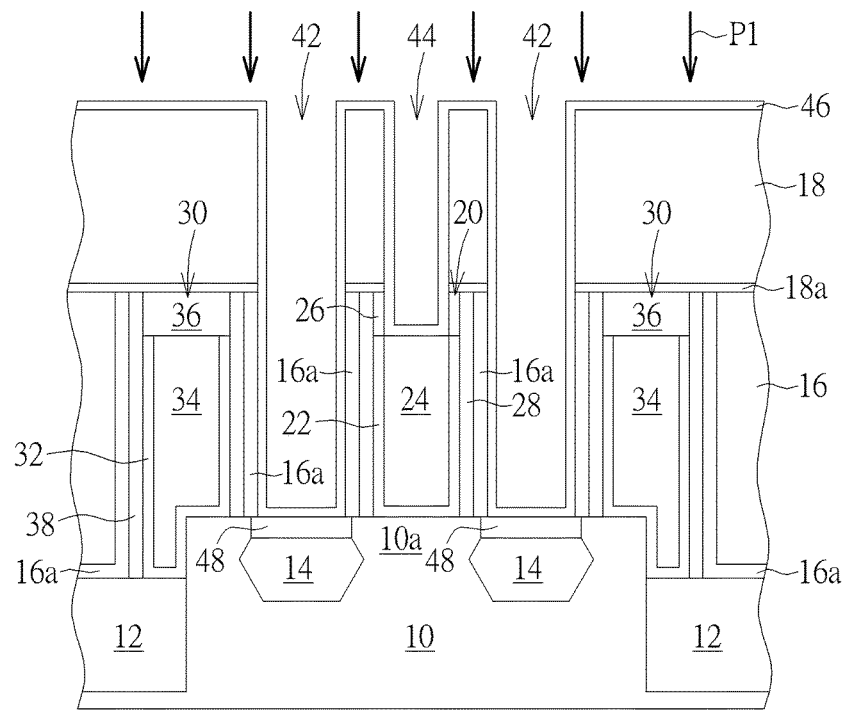

Please refer to FIG. 3. After forming the openings 42 and 44, a liner 46 is formed conformally covering the sidewalls and bottoms of the openings 42 and 44. The liner 46 is in direct contact with the source/drain regions 14 exposed in the opening 42 and the gate electrode 24 exposed in the opening 44. A rapid thermal process (RTP) P1 is then performed to form a silicide layer 48 in the substrate 10. Specifically, during the RTP P1, the metal compound comprised in the liner 46 reacts with the silicon in the source/drain region 14 to form the silicide layer 48. According to the preferred embodiment, the liner 46 is multi-layered, comprising (for example) a titanium (Ti) layer and a titanium nitride (TiN) layer. The titanium layer of the liner 46 directly contacts the source/drain region 14 and reacts with the silicon of the source/drain region 14 to form a titanium silicide (TiSix) layer. In other embodiments, the liner 46 may merely include titanium.

Figure 4:
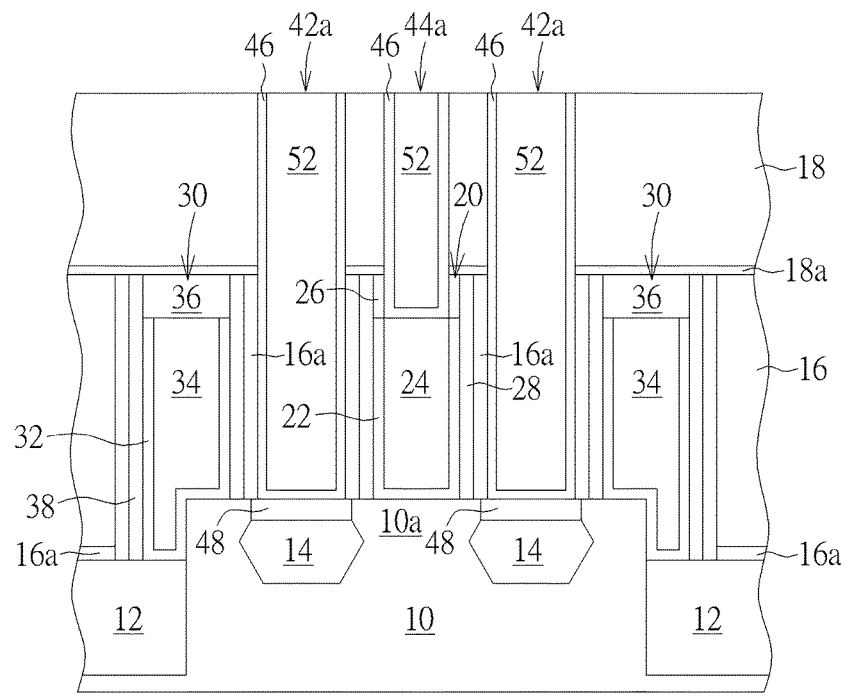

Please refer to FIG. 4. A conductive material 52 is deposited on the substrate 10 and fills the openings 42 and 44. The excess conductive material 52 outside the openings 42 and 44 is then removed, forming the source/drain contact plug 42a and the gate contact plug 44a. The conductive material 52 may be chosen from a group comprising cobalt (Co), copper (Cu), aluminum (Al), tungsten (W), nickel (Ni), platinum (Pt), tantalum (Ta) and titanium (Ti) or any combination thereof, but is not limited hereto. In the preferred embodiment, the conductive material 52 is cobalt (Co), which is formed by (for example) an atomic layer deposition (ALD) process. In conventional semiconductor technology, tungsten is the most popular filling material for forming contact plugs of semiconductor devices. The present invention using cobalt as the conductive material 52 may achieve better gap filling and provide a lower resistance, especially for small openings. For example, according to an experimental result, an opening smaller than 15 nm in diameter would have much lower resistance when filled with cobalt rather than filled with tungsten. Another difference between different conductive materials 52 is that they may have different stresses for the substrate 10. According to an experimental result of the present invention, a cobalt film and a tungsten film may both provide tensile stress for a semiconductor substrate. The cobalt film may have a tensile stress between 400 to 800 MPa, and the tungsten film may have a tensile stress around 1600 MPa. In other words, a contact plug filled with cobalt has a tensile stress smaller than that of a contact plug filled with tungsten.

Figure 5:
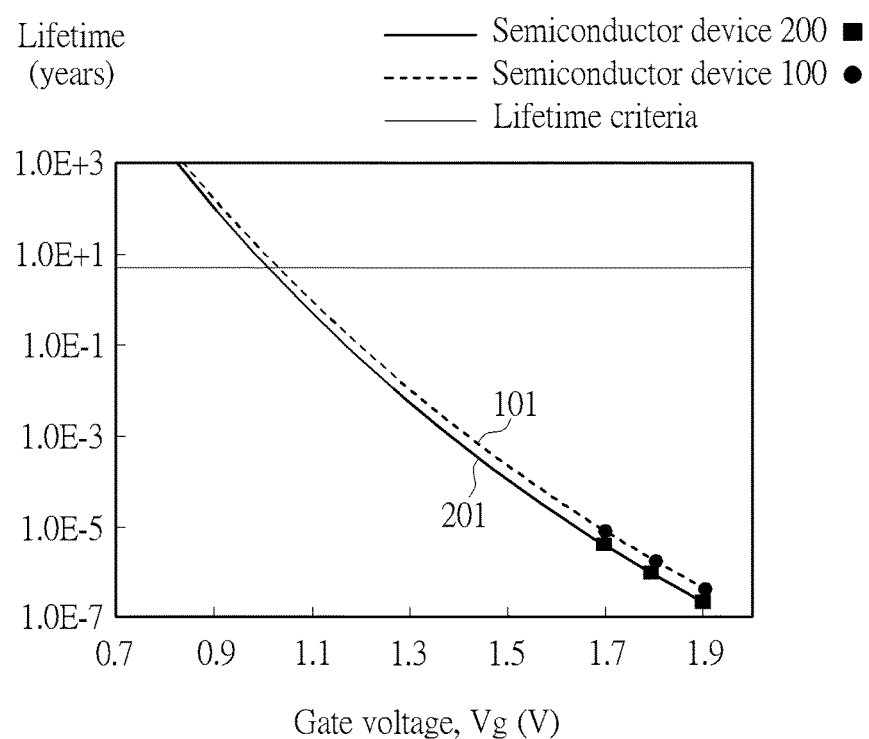
FIG. 5 is a plot of the accelerated device lifetime versus gate voltage of the semiconductor devices according to an experimental result of the present invention.
Figure 6:
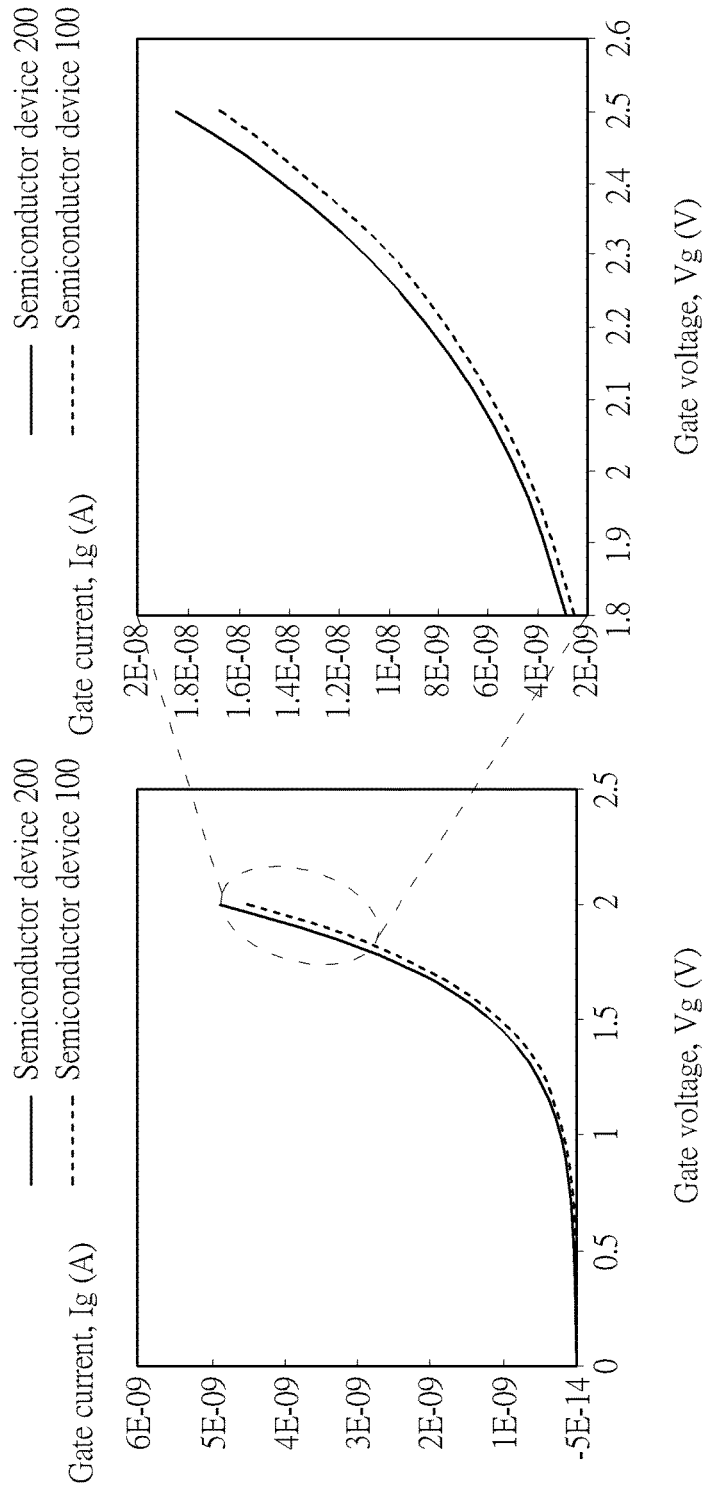
FIG. 6 is a plot of the gate leakage current versus gate stress voltage of the semiconductor devices according to an experimental result of the present invention.

FIG. 5 and FIG. 6 are experimental results of the negative bias temperature instability (NBTI) testing of semiconductor device 100 and semiconductor device 200 according to a preferred embodiment of the present invention. The semiconductor device 100 and the semiconductor device 200 are test structures (testkeys) designed for NBTI testing. The semiconductor device 100 and the semiconductor device 200 are formed on a semiconductor wafer through the manufacturing process previously illustrated. The semiconductor device 100 and the semiconductor device 200 in the testing are both p-FETs, preferably having layouts according to the minimum rules of the technology node. This enables them to simulate the most critical situations and therefore be able to provide a precise predicted lifetime. The semiconductor device 100 and the semiconductor device 200 are formed on different wafers using the same set of masks and through mostly the same process, therefore they substantially have the same structure and dimension. The major difference between the semiconductor device 100 and the semiconductor device 200 is that the contact plugs of the semiconductor device 100 and the semiconductor device 200 are filled with different metals. The contact plugs of the semiconductor device 100 are filled with cobalt, and the contact plug of the semiconductor device 200 is filled with tungsten.

Please refer to FIG. 5. FIG. 5 shows an experimental NBTI testing result of the semiconductor device 100 and the semiconductor device 200, wherein the respective plot of the accelerated device lifetime versus the gate voltage (Vg) of the semiconductor devices 100 and 200 are drawn in the same diagram for comparison. The plots may be obtained by performing a conventional NBTI testing method. For example, a semiconductor device under investigation is provided and its initial electrical characteristics such as I-V curve and the threshold voltage are measured before being stressed. After that, the temperature of the semiconductor device is raised to a stress temperature and a stress gate voltage (Vg) which is greater than the normal operating gate voltage is applied to the semiconductor device. The threshold voltage (Vth) of the semiconductor device is periodically measured during the stress period, and the shift amount of threshold voltage (ΔVth) is obtained by being compared with the initial threshold voltage. In FIG. 5, the plot 101 of the semiconductor device 100 and the plot 201 of the semiconductor device 200 may be obtained according to the following procedure. Three stress gate voltages 1.7V, 1.8V and 1.9V are applied to the semiconductor device 100 and the semiconductor device 200 under the stress temperature of 125° C., and the ΔVth at each stress gate voltages is measured. The collected data is then input into a functional equation of ΔVth and lifetime to obtain the accelerated device lifetime at each stress gate voltage. The plots 101 and 201 of the predicted lifetimes versus various gate voltages are then extrapolated by curve fitting analysis. According to experimental result shown in FIG. 5, when the same gate voltage is applied, the semiconductor device 100 having cobalt filled contact plugs have a longer lifetime than that of the semiconductor device 200 having tungsten filled contact plugs. That is, the semiconductor device 100 has a better NBTI performance in comparison with the semiconductor device 200. From another point of view, at a pre-determined lifetime criteria, the semiconductor device 100 is able to sustain a higher stress gate voltage than the semiconductor device 200. For example, at the lifetime criteria shown in FIG. 5 (ΔVth does not exceed 56 mV after 5-years of operation under a stress temperature 125° C.), the maximum sustainable stress gate voltage of the semiconductor device 100 is approximately 18 mV higher than that of the semiconductor device 200. In other words, the semiconductor device 100 is able to tolerate a larger gate voltage shift during normal operation without decreasing the NBTI performance.

Please refer to FIG. 6, which shows the plot of gate leakage current versus gate stress voltage of the semiconductor devices 100 (having cobalt filled contact plugs) and the semiconductor devices 200 (having tungsten filled contact plugs) obtained during the NBTI testing of FIG. 5. The plot at stress gate voltage between 1.8V and 2.5V is enlarged in the right portion of FIG. 6 for greater detail.

The mechanism causing the NBTI phenomenon is still in dispute, but the reaction-diffusion model is the most widely accepted hypothesis. When a p-FET is heated to a higher temperature and a negative gate voltage is applied to the p-FET, the holes in the substrate of the p-FET may be thermally excited and injected into the interface between the substrate and the gate dielectric layer (for example, the interface of the silicon substrate and the silicon oxide). The Si—H bonds in the interface are consequently broken and H atoms are released. The H atoms or H2 molecular formed from a combination of two H atoms may diffuse into the gate dielectric layer and leave dangling bonds in the interface, which may cause the threshold voltage of the p-FET to shift. After research, it was discovered that when a tensile stress is applied to the p-FET, the potential difference between the substrate and the gate dielectric layer may be decreased and the opportunity for holes to be injected into the interface is increased, consequently resulting in a degradation of the NBTI performance. As stated previously, cobalt film comprises a smaller tensile stress than tungsten film, which means the semiconductor device 100 having cobalt filled contact plugs may have a relatively smaller tensile stress than the semiconductor device 200 having tungsten filled contact plugs. Therefore, the semiconductor device 100 may have a larger potential difference between the substrate and the gate dielectric layer than that of the semiconductor device 200, and the opportunity for holes to inject into the interface of the semiconductor device 100 is less than that of the semiconductor device 200. As a result, the semiconductor device 100 may have less hole-injection, less dangling bonds, more stable threshold voltage and better NBTI performance in comparison with the semiconductor device 200.

During the NBTI testing, the injected holes and H atoms released from broken Si—H bonds may be attracted by the negative gate voltage. The holes and H atoms may tunnel through the gate dielectric layer and a larger gate leakage current (Ig) may be measured accordingly. In other words, larger gate leakage current may indicate more injected holes, more dangling bonds and worse NBTI performance, and smaller gate leakage current may indicate fewer injected holes, fewer dangling bonds and better NBTI performance. In FIG. 6, the gate leakage current of the semiconductor device 100 at various stress gate voltages (Vg) is smaller than that of the semiconductor device 200, which supports the present invention idea that the semiconductor device 100 having cobalt filled contact plugs has less tensile stress compared with the semiconductor device 200 having tungsten filled contact plugs. The semiconductor device 100 has a higher potential barrier preventing holes from being injected into the interface; therefore fewer dangling bonds are formed and a better NBTI performance is obtained.

Figure 7:
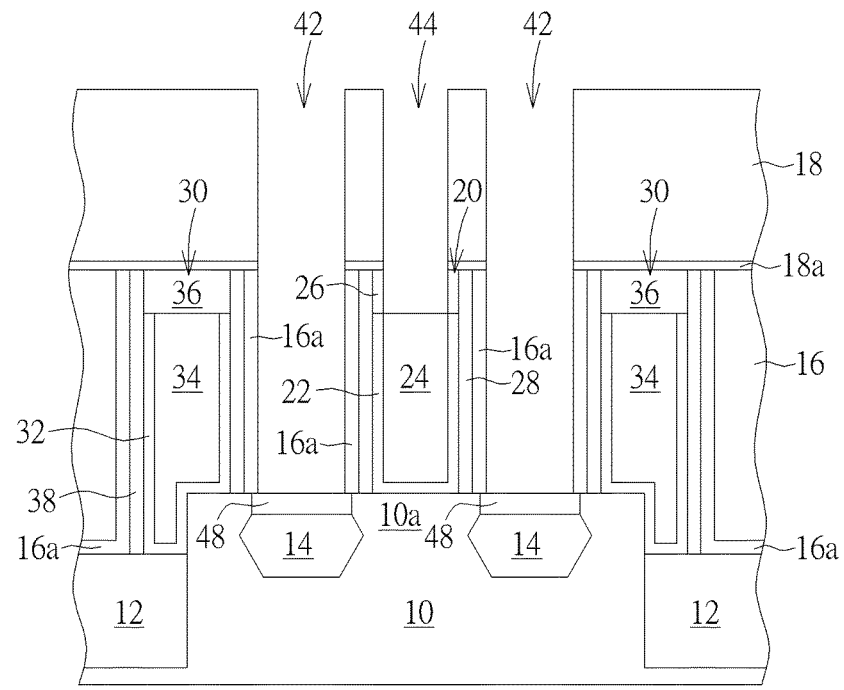
FIG. 7 to FIG. 8 illustrate a modification of the semiconductor device of the preferred embodiment shown in FIG. 1 to FIG. 4.
Figure 8:
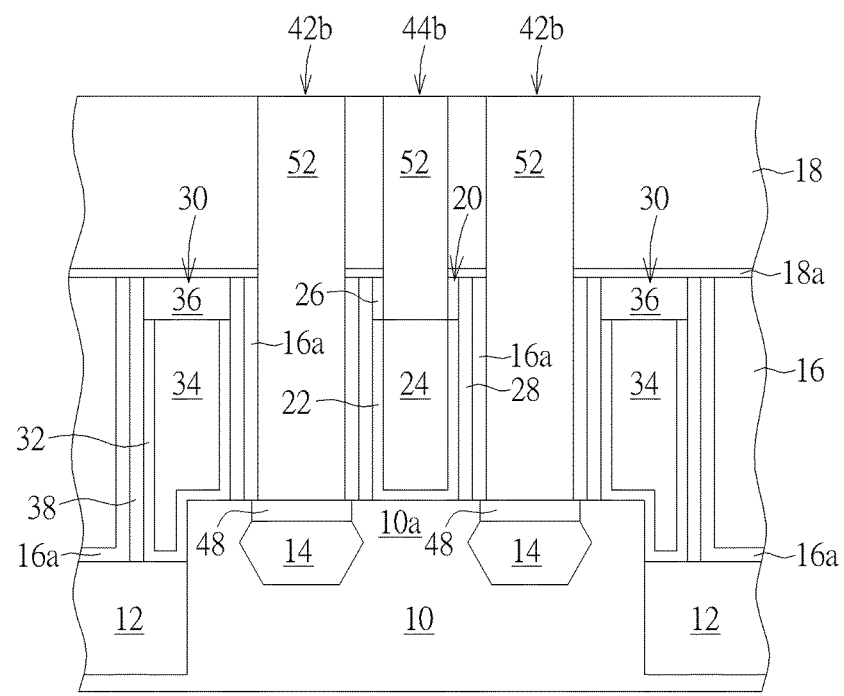

Please refer to FIG. 7 to FIG. 8, which show a modification of the preferred embodiment shown in FIG. 1 to FIG. 4. As shown in FIG. 7, after forming the silicide layer 48 by performing RTP P1 (the step illustrated in FIG. 3), the remaining liner 46 is removed. Subsequently, the conductive material 52 is formed to fill the openings 42 and 44, the excess conductive material 52 outside the openings 42 and 44 is removed, and the source/drain contact plug 42b and the gate contact plug 44b are obtained, as shown in FIG. 8. According to the modification, the conductive material 52 of the source/drain contact plug 42b is in direct contact with the silicide layer 48, the first interlayer dielectric layer 16 (the CESL 16a) and the second interlayer dielectric layer 18. In the embodiments when the space between the gate structure 20 and the dummy gate structure 30 is so small that the portion of the CESL 16a on the spacer 28 and the spacer 38 is removed, the conductive material 52 may be in direct contact with the spacers 28 and 38. Removing the remaining liner 46 may help the conductive material 52 to fill the openings 42 and 44. An adhesion layer (not shown) may be formed in the openings 42 and 44 after removing the liner 46 for increasing the adhesion of the conductive material 52.

Figure 9:
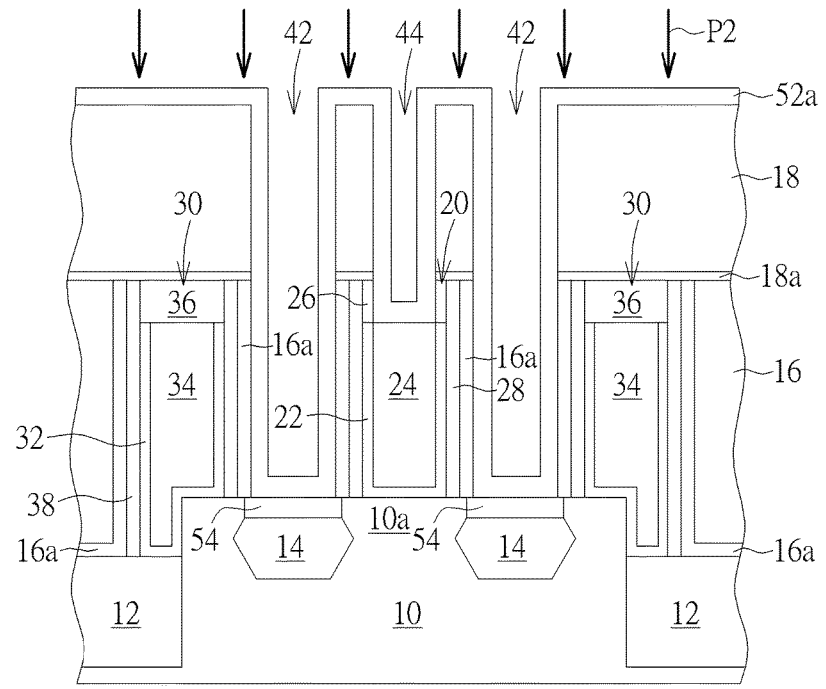
FIG. 9 to FIG. 10 illustrate another modification of the semiconductor device of the preferred embodiment shown in FIG. 1 to FIG. 4.
Figure 10:
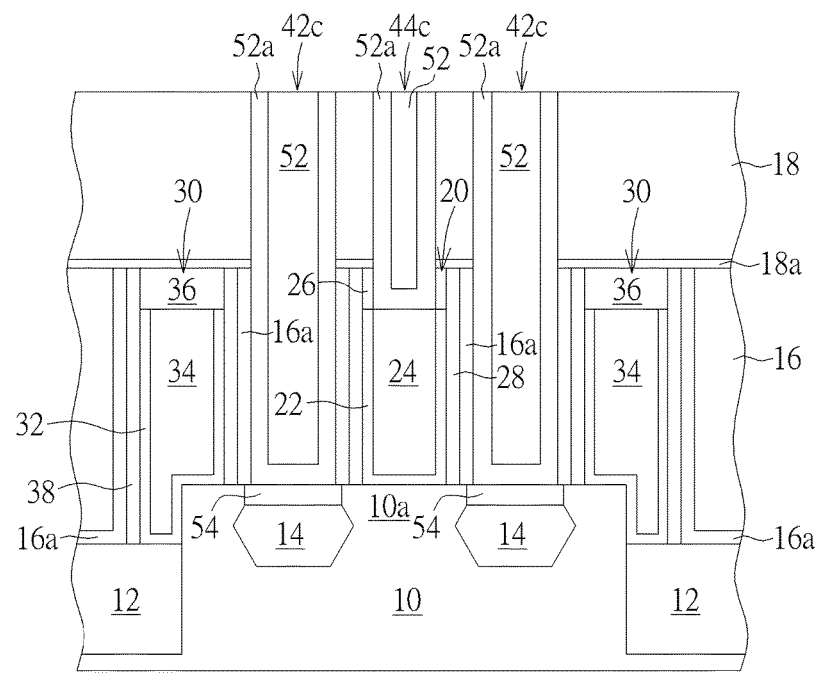

Please refer to FIG. 9 to FIG. 10, which illustrate another modification of the preferred embodiment shown in FIG. 1 to FIG. 4. After forming the openings 42 and 44, a cobalt liner 52a (instead of the Ti/TiN liner 46 in FIG. 3) is formed conformally along the sidewalls and bottoms of the openings 42 and 44. An RTP P2 is then performed to make the cobalt liner 52a react with the silicon of the source/drain region 14, thereby forming a cobalt silicide layer (CoSix) 54. After that, the conductive material 52 made of cobalt is formed filling the openings 42 and 44, and the excess conductive material 52 outside the openings 42 and 44 is removed to obtain the source/drain contact plug 42c and the gate contact plug 44c. Preferably, the cobalt liner 52a and the conductive material 52 (made of cobalt) are formed successively by an ALD process. Several cycles of the ALD process are performed to form the cobalt liner 52a, and then the RTP P2 is performed to make the cobalt liner 52a react with the source/drain region 14, thereby forming the cobalt silicide layer 54. After that, more ALD cycles are performed to form the conductive material 52 until the openings 42 and 44 are completely filled. The modification shown in FIG. 9 to FIG. 10 may require simplified process steps.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor device, comprising:
   forming a p-type field-effect transistor (p-FET) on a semiconductor substrate;
   forming a dielectric layer on the semiconductor substrate, covering the p-FET;
   forming at least an opening in the dielectric layer to expose a source/drain region of the p-FET;
   forming a liner conformally covering the opening; and
   forming a conductive material on the liner and completely filling the opening, wherein the conductive material is made of cobalt (Co) and has a top surface coplanar with a top surface of the dielectric layer and provides a pre-determined magnitude of tensile stress to the p-FET to obtain an improved negative bias temperature instability (NBTI) of the p-FET.

2. The method for forming a semiconductor device according to claim 1, wherein the conductive material is formed by performing an atomic layer deposition (ALD) process.

3. The method for forming a semiconductor device according to claim 1, further comprising performing a rapid thermal process (RTP) to react the liner with the source/drain region to form a silicide layer in the source/drain region before forming the conductive material.

4. The method for forming a semiconductor device according to claim 3, wherein the silicide layer comprises titanium silicide.

5. The method for forming a semiconductor device according to claim 3, wherein the silicide layer comprises cobalt silicide.

6. The method for forming a semiconductor device according to claim 1, wherein the liner comprises cobalt (Co), titanium (Ti), titanium nitride (TiN), tantalum (Ta), tantalum nitride (TaN) or any combination thereof.

7. The method for forming a semiconductor device according to claim 1, wherein the pre-determined magnitude of tensile stress of the conductive material is between 400 and 800 MPa.

8. A semiconductor device, comprising:
   a semiconductor substrate;
   a p-type field-effect transistor (p-FET) formed on the semiconductor substrate;
   a dielectric layer formed on the semiconductor substrate and covering the p-FET; and
   a contact plug formed in the dielectric layer, adjacent to one side of the p-FET and contacting a source/drain region of the p-FET, wherein the contact plug is filled up with a conductive material comprising cobalt (Co) and has a liner disposed between the conductive material and the dielectric layer and the source/drain region of the p-FET, wherein a top surface of the liner and a top surface of the conductive material are coplanar with a top surface of the dielectric layer, wherein the conductive material has a pre-determined magnitude of tensile stress to the p-FET to obtain an improved negative bias temperature instability (NBTI) of the p-FET.

9. The semiconductor device according to claim 8, further comprising a silicide layer between the liner and the source/drain region.

10. The semiconductor device according to claim 9, wherein the silicide layer comprises titanium silicide.

11. The semiconductor device according to claim 9, wherein the silicide layer comprises cobalt silicide.

12. The semiconductor device according to claim 8, wherein the liner comprises cobalt (co), titanium (Ti), titanium nitride (TiN), tantalum (Ta), tantalum nitride (TaN) or any combination thereof.

13. The semiconductor device according to claim 8, wherein the conductive material is not in direct contact with the dielectric layer.

14. The semiconductor device according to claim 8, wherein the pre-determined magnitude of tensile stress of the conductive material is between 400 and 800 MPa.

* * * * *